(12) United States Patent
Lee (10) Patent No.: US 6,979,587 B2
(45) Date of Patent: Dec. 27, 2005

(54) IMAGE SENSOR AND METHOD FOR FABRICATING THE SAME

(75) Inventor: Won-Ho Lee, Ichon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 224 days.

(21) Appl. No.: 10/330,287

(22) Filed: Dec. 30, 2002

(65) Prior Publication Data

US 2003/0127666 A1 Jul. 10, 2003

(30) Foreign Application Priority Data

Jan. 10, 2002 (KR) .................................. 10-2002-0001367

(51) Int. Cl.⁷ .............................................. H01L 21/00
(52) U.S. Cl. ...................... 438/57; 438/451; 257/292; 257/446
(58) Field of Search ............................ 438/57, 73, 449, 438/451, 525, 527, 529; 257/291, 292, 446, 463

(56) References Cited

U.S. PATENT DOCUMENTS

| | | | |
|---|---|---|---|
| 6,417,023 B2 * | 7/2002 | Suzuki et al. .................. | 438/73 |
| 6,528,342 B2 * | 3/2003 | Miyagawa et al. ............ | 438/79 |
| 2002/0117699 A1 * | 8/2002 | Francois ....................... | 257/291 |

FOREIGN PATENT DOCUMENTS

KR 2002-0001635 A 9/2002

OTHER PUBLICATIONS

Son, Jeong-Hwan et al, IEEE, 1999, pp. 122–124.

Yonemoto, Kazuya et al, IEEE, 12/2000, vol. 35, No. 12, pp. 2038–2043.

Blanksby, Andrew J., IEEE, 1/2000, vol. 47, No. 1, pp. 55–64.

* cited by examiner

*Primary Examiner*—Amir Zarabian
*Assistant Examiner*—Christy Novacek
(74) *Attorney, Agent, or Firm*—Birch, Stewart, Kolasch & Birch, LLP (57) ABSTRACT

The present invention provides an image sensor capable of suppressing the dark current due to crystalline defects occurring at an edge of a field oxide layer and a method for fabricating the same. The present invention provides an image sensor including: a semiconductor substrate; an active area including a photodiode area formed in a predetermined position of the substrate, a floating diffusion area having a smaller area than the photodiode area and a channel area having a bottle-neck structure connecting to the photodiode area and the floating diffusion area; a field area for isolating electrically the active area; a field stop layer being formed beneath the field area by having a wider area than the field area through an expansion towards the active area with a first width; and a gate electrode formed on the substrate by covering the channel area and having one side superposed with a second width on one entire side of the photodiode contacted to the channel area.

10 Claims, 11 Drawing Sheets

IMAGE SENSOR AND METHOD FOR FABRICATING THE SAME

This nonprovisional application claims priority under 35 U.S.C. §119(a) on Patent Application No. 2002-0001367 filed in KOREA on Jan. 10, 2002, which is herein incorporated by reference.

FIELD OF THE INVENTION

The present invention relates to a method for fabricating a semiconductor device; and, more particularly, to an image sensor and a method for fabricating the same.

DESCRIPTION OF RELATED ARTS

Image sensor is a semiconductor device that converts an optical image into an electrical signal. Among the image sensors, a charge coupled device (CCD) is a device wherein an individual metal-oxide-silicon (CMOS) capacitor is closely allocated to each other, and carriers are stored and transferred to the MOS capacitor. A complementary metal-oxide semiconductor device (CMOS) image sensor employs CMOS technology using a control circuit and a signal processing circuit as peripheral circuits. In the CMOS image sensor, MOS transistors are formed as the same number of pixels in the peripheral circuit, and a switching mode is adopted for detecting sequentially outputs with use of the MOS transistors.

The CMOS image sensor includes a color filter arrayed on top of a light sensing element that generates and stores an optical charge after receiving light from an external source. The color filter array (CFA) can be classified with three colors of red (R), green (G) and blue (B) or those of yellow (Y), magenta (M) and cyan (C).

Also, the image sensor is constituted with a light sensing element for sensing light and a logic circuit component for processing the sensed light into an electrical signal, which is, in turn, systemized into data. There has been numerously attempted to improve a fill factor, which represents an areal ratio of the light sensing element with respect to the overall image sensor. However, these attempts are limited since the logic circuit component cannot be basically removed.

Accordingly, there introduced a light condensing technology for changing paths of incident lights that enter to areas other than the light sensing element and condensing the incident lights into the light sensing element so as to enhance a level of light sensing. To realize the light condensing technology, a method for forming a microlens on the color filter of the image sensor is particularly used.

A unit pixel of the typical CMOS image sensor has one photodiode area (hereinafter referred as to PD) and four N-channel metal-oxide semiconductor (NMOS) transistors, that are, a transfer transistor $T_x$, a reset transistor $R_x$, select transistor $S_x$ and a drive transistor $D_x$. With respect to a specific function of each of the four NMOS transistors, the $T_x$ is for transferring photo-generated charges collected at the PD to a floating diffusion area (hereinafter referred as to FD). The $R_x$ is for resetting the FD by setting an electric potential of a node into a desired value and then releasing a charge ($C_{pd}$). Also, the $D_x$ enacts as a source follower buffer amplifier, and the $S_x$ is for providing a function of addressing with a switch.

Herein, the $T_x$ and the $R_x$ uses a native NMOS transistor, whereas the $D_x$ and the $S_x$ uses a normal NMOS transistor. Especially, the $R_x$ is a transistor for a correlated double sampling (CDS).

The unit pixel of the above-described CMOS image sensor uses the native NMOS transistor so to sense rays in the visible wavelength bandwidth at the PD and then transfer detected photo-generated charges to the FD, i.e., an amount of the photo-generated charges transferred to a gate of the $D_x$ is outputted in an electric signal from an output terminal $V_{out}$.

Figure 1:
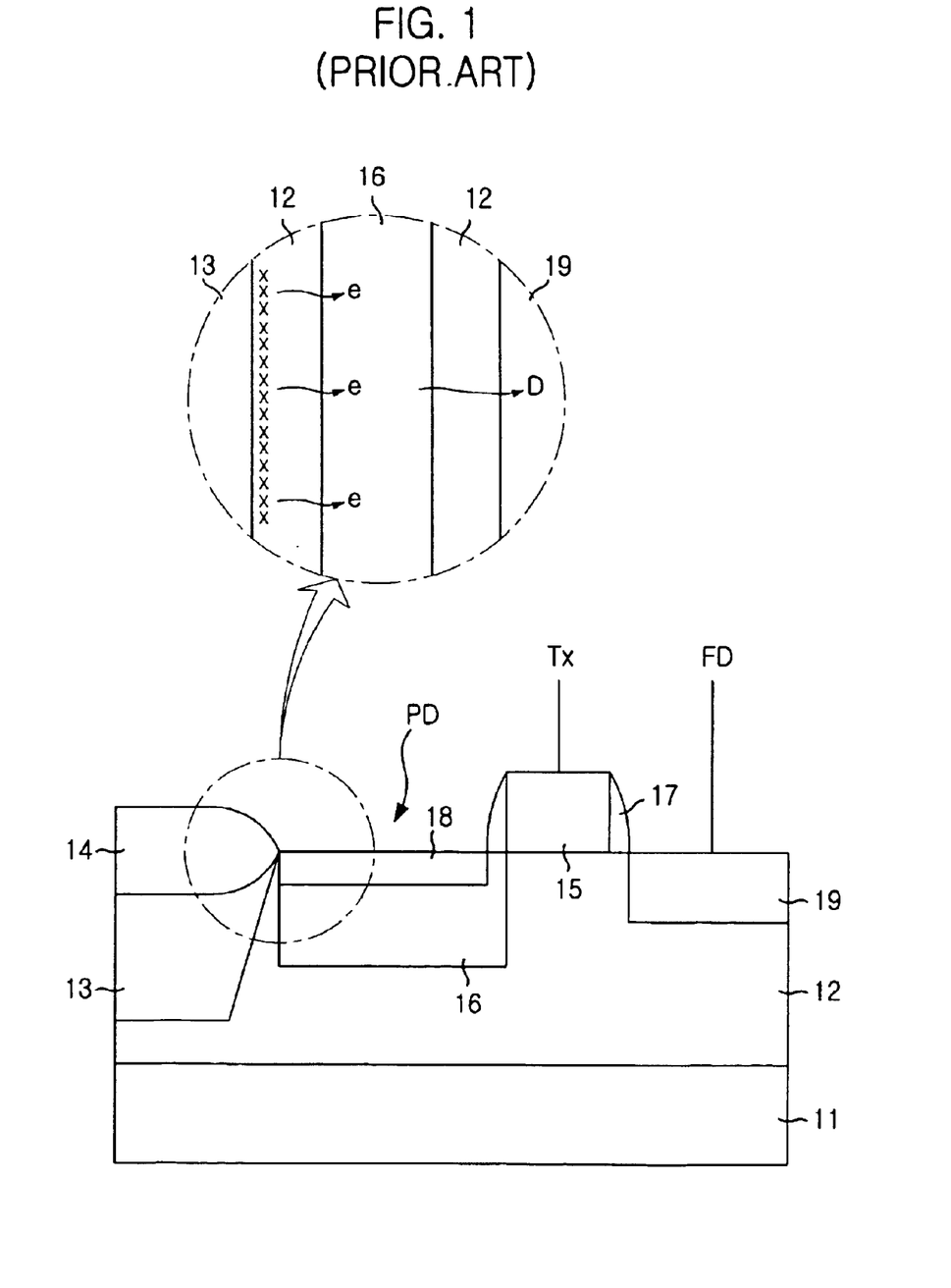
FIG. 1 is a cross-sectional view showing a complementary metal-oxide semiconductor (CMOS) image sensor in accordance with a prior art.

FIG. 1 is a cross-sectional view showing a typical CMOS image sensor in accordance with a prior art. Particularly, FIG. 1 shows merely a PD, a transfer transistor $T_x$ and a FD.

Referring to FIG. 1, a p-type epi layer 12 that is undergone with an epitaxial growth is formed on a $P^+$ substrate 11. Also, a field oxide layer 14 for isolating devices is formed on the p-type epi layer 12. A field stop layer 13 for an n-channel field stop layer is formed beneath the field oxide layer 14.

Herein, the field stop layer 13 is allocated only beneath the field oxide layer 14 since ions are implanted without any tilts into the p-type epi layer 12 where the field oxide layer 14 is formed. Therefore, an n diffusion area 16 constituting the PD has only a boundary with an edge of the field oxide layer 14, but does not affect an area of the $n^-$ diffusion area 16.

In addition, a gate electrode 15 of a $T_x$ is formed on the p-type epi layer 12. Also, a spacer 17 is then formed at lateral sides of the gate electrode 15. The $n^-$ diffusion area 16 is formed deeply in the p-type epi layer 12 by being aligned to an edge of one side of the gate electrode 15. A shallow $p^0$ diffusion layer 18 is then formed on top of the $n^-$ diffusion layer 16 as being aligned to one side of the spacer 17.

Eventually, a PD including a deep $n^-$ diffusion area 16 and a shallow $p^0$ diffusion area 18 is formed. A FD 19 is formed in the p-type epi layer 12 as being aligned to the spacer formed at the other side of the gate electrode 15.

Meanwhile, one side of an ion implantation mask $MK_1$ (not shown) for forming the $n^-$ diffusion area 16 is aligned to a center of the gate electrode of the $T_x$, while the other side of the ion implantation mask $MK_1$ is aligned to the field oxide layer 14.

Figure 2:
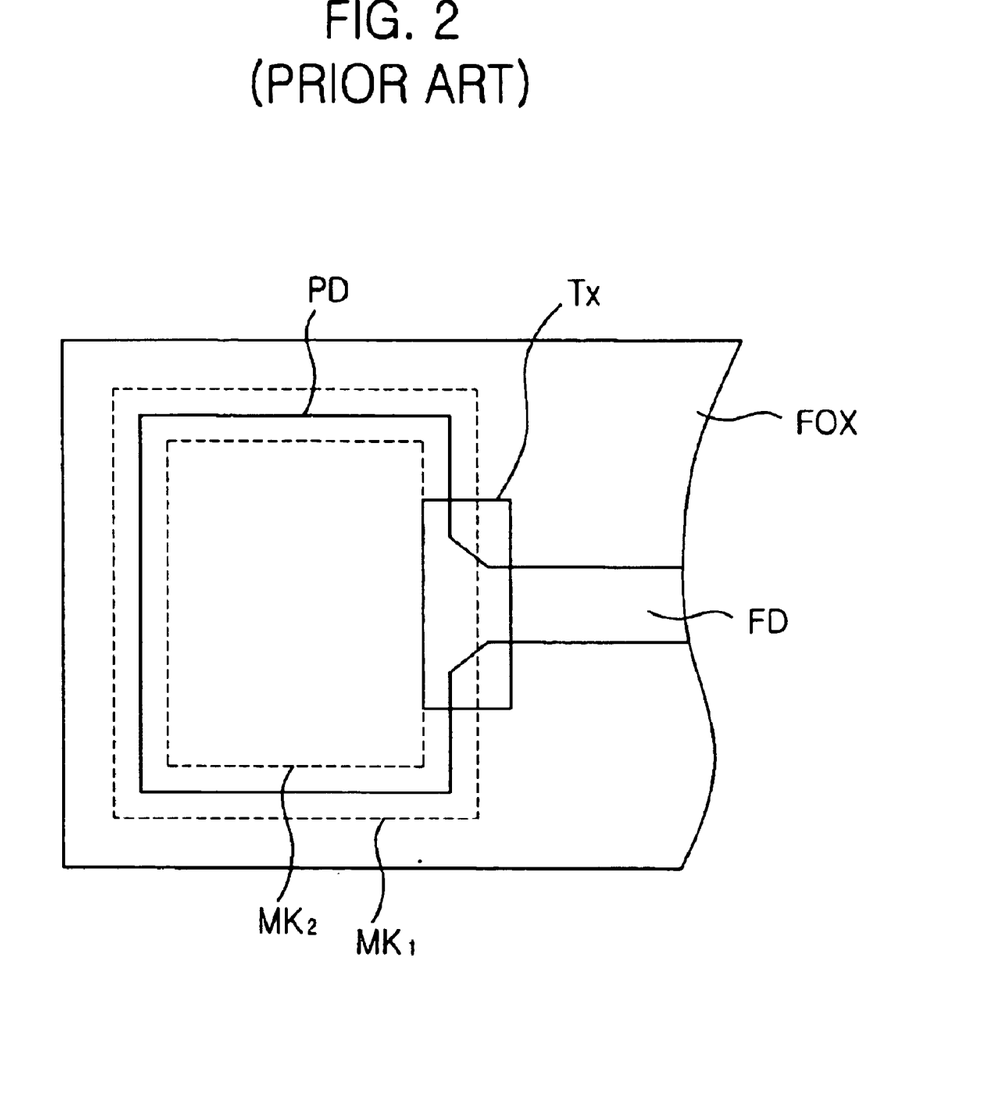
FIG. 2 is a plane view showing the CMOS image sensor in accordance with the prior art.

FIG. 2 is a plane view of FIG. 1 showing the typical CMOS image sensor in accordance with the prior art. One side of the gate electrode of the $T_x$ is overlapped to an active area for providing the PD. The FD is formed below the other side of the gate electrode of the $T_x$.

Also, in the active area defined by the field oxide layer (FOX), the PD has a relatively larger area; however, an area between the PD and the FD becomes smaller. This effect is called a bottle-neck effect.

Meanwhile, as shown in FIG. 1, when forming the $n^-$ diffusion layer 16 constituting the PD, the $n^-$ diffusion layer 16 is formed entirely on the active area except for a portion superposed on the gate electrode 15 of the $T_x$ since the ion implantation mask $MK_1$ has a wide width compared to the actually formed $n^-$ diffusion layer 16. Therefore, the $n^-$ diffusion area 16 is contacted to the field oxide layer FOX.

In the above-described prior art, if there exists a reverse bias between the $n^-$ diffusion layer 16 and the p-area including the $p^0$ diffusion layer and the p-type epi layer, the $n^-$ diffusion layer 16 becomes fully depleted when a concentration of impurities contained in the $n^-$ diffusion layer 16 and the p-area is properly controlled. As a result of this full depletion, the depletion is also extended to the p-type epi layer 12 allocated beneath the $n^-$ diffusion layer 16 and the $p^0$ diffusion layer 18 allocated above the $n^-$ diffusion layer 16. Especially, the depletion occurs in more extents in the p-type epi layer 12 having a relatively lower dopant concentration.

The image sensor having the above PD takes out electrons stored into the PD and obtains an electrical output signal, i.e., current or voltage. A maximum output signal is in a proportional relationship with the number of electrons that can be taken out from the PD, and thus, the number of electrons generated and stored in the PD due to inputs of light should be increased in order to increase the output signals.

The electrons generated at the depletion layer of the PD are converted to an electrical output signal such as a voltage or a current. Hence, the ion implantation is proceeded in such that a dopant concentration of the $p^0$ diffusion layer 18, which is a surface layer, should be higher than that of the $n^-$ diffusion layer 16 and the p-type epi layer 12, which are a bottom layer.

Meanwhile, in the prior art, when incident lights are inputted, there occurs an electron hole pair (EHP) at the $n^-$ diffusion layer 16, which is the depletion layer. The hole (H) of the EHP is drained to the $p^+$ substrate 11, and the electron (e) is accumulated and transferred to the FD 19 through the transfer transistor $T_x$ so as to attain image data.

However, the prior art has a problem in that crystalline defects occur mainly at the edge of the field oxide layer 13 when applying an oxidation process to the field oxide layer 13. A point defect, a line defect, an area defect and a volume defect are examples of the crystalline defects.

Eventually, electrons (e) are generated and stored due to the crystalline defects occurring at the edge of the field oxide layer 14 even when incident lights are not inputted. Therefore, there occurs dark current (D) flowing from the PD to the FD 19.

In other words, the electrons should be generated and stored at the depletion layer, i.e., the $n^-$ diffusion layer 16 of the PD only when the incident lights are inputted, and then, the stored electrons are transferred to the FD so to make current flow. However, the crystalline defects present at the edge of the field oxide layer 14 are in a state of generating electrons easily in a thermal aspect even without inputs of the incident lights. Thus, if there exists a plurality of defects even in a dark state without any light, the image sensor shows an abnormal state by acting as if there are inputs of the incident lights.

To solve the above problem, it is suggested to employ an ion implantation mask $MK_2$ of which linewidth is relatively smaller than the $MK_1$ for forming the deep $n^-$ diffusion layer 16 (referred to FIG. 2). However, this approach is sensitive to an overlay since there occurs no self-alignment during the ion implantation mask $MK_2$ process for forming the deep $n^-$ diffusion layer 16. Also, there is another problem in that the $n^-$ diffusion layer 16 is extended near to an edge of the field oxide layer FOX due to a subsequent thermal process.

SUMMARY OF THE INVENTION

It is, therefore, an object of the present invention to provide an image sensor capable of suppressing generation of dark current due to crystalline defects at an edge of a field oxide layer and a method for fabricating the same.

In accordance with an aspect of the present invention, there is provided an image sensor, comprising: a semiconductor substrate; an active area including a photodiode area formed in a predetermined position of the substrate, a floating diffusion area having a smaller area than the photodiode area and a channel area having a bottle-neck structure connecting to the photodiode area and the floating diffusion area; a field area for isolating electrically the active area; a field stop layer being formed beneath the field area by having a wider area than the field area through an expansion towards the active area with a first width; and a gate electrode formed on the substrate by covering the channel area and having one side superposed with a second width on one entire side of the photodiode contacted to the channel area.

In accordance with another aspect of the present invention, there is also provided an image sensor, comprising: a substrate; an active area including a photodiode area formed in a predetermined position of the substrate, a floating diffusion area having a smaller area than the photodiode area and a channel area having a bottle-neck structure connecting to the photodiode area and the floating diffusion area; a field area for isolating electrically the active area; a field stop layer being formed beneath the field area by having a wider area than the field area through an expansion towards the photodiode area with a first width; and a gate electrode formed on the substrate by covering the channel area and having one side superposed with a second width on one entire side of the photodiode contacted to the channel area.

In accordance with still another aspect of the present invention, there is also provided a method for fabricating an image sensor, comprising the steps of: forming an isolation mask that exposes partially a surface of the substrate; forming a first diffusion layer having a wider area than an exposed area of the isolation mask in the exposed substrate; forming a field oxide layer having a smaller area than the first diffusion layer on the first diffusion layer; forming a gate electrode on an active area of the substrate defined by the field oxide layer; forming a second diffusion layer being aligned to an edge of one side of the gate electrode in the substrate and to the first diffusion layer; and forming a third diffusion layer being aligned with a predetermined distance from the edge of the one side of the gate electrode formed in the second diffusion layer.

In accordance with still another aspect of the present invention, there is also provided a method for forming an image sensor, comprising the steps of: forming on the substrate a first isolation mask that exposes a surface of one side of the substrate; forming a first diffusion layer having a wider area than an exposed area of the first isolation mask formed in the exposed substrate; forming on the substrate a second isolation mask that exposes the other side of the substrate; forming a second diffusion layer having an area identical to an exposed area of the second isolation mask formed in the exposed substrate; forming on the first diffusion layer a first field oxide layer having a smaller area than the first diffusion layer as simultaneously as forming on the second diffusion layer a second field oxide layer having an area identical to the second diffusion layer; forming a gate electrode extending on the active area of the substrate and simultaneously on the second field oxide layer; forming a third diffusion layer being aligned to an edge of one side of the gate electrode in the substrate and the first diffusion layer; and forming a forth diffusion layer being aligned with a predetermined distance from the edge of the one side of the gate electrode in the third diffusion layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 3:
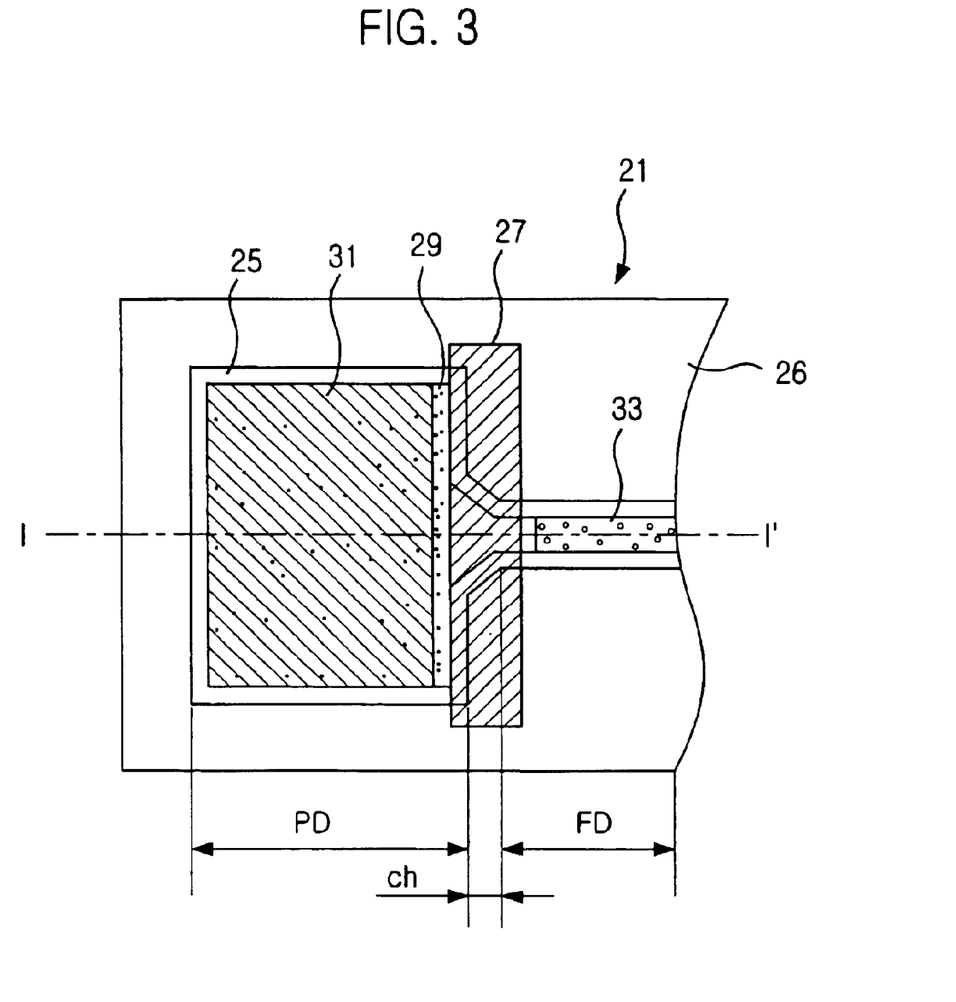
FIG. 3 is a plane view showing a CMOS image sensor in accordance with a first preferred embodiment of the present invention.

FIG. 3 is a plane view showing a complementary metal-oxide semiconductor device (hereinafter referred as to CMOS) image sensor in accordance with a first preferred embodiment of the present invention. The CMOS image sensor shown in FIG. 3 includes a photodiode area (hereinafter referred as to PD), a gate electrode of a transfer transistor $T_x$ and a floating diffusion area (hereinafter referred as to FD).

On a predetermined place of a substrate 21, an active area including the PD, the FD having a smaller area than the PD and a channel area ch having a bottle-neck structure that connects the PD and the FD is formed.

Then, a field oxide layer 26 for isolating electrically the active area is formed. A field stop layer 25 having a greater area than the field oxide layer 26 as being extended towards the active area with a first predetermined distance is formed beneath the field oxide layer 26.

Also, a gate electrode 27 having one side superposed entirely on one side of the PD connected to the channel area ch with a second predetermined distance and the other side aligned to the FD is formed on the substrate 21. Herein, the gate electrode also covers the channel area ch.

In the mean time, the PD includes an $n^-$ diffusion area 29 formed by being self-aligned to the field stop layer 25 and the one side of the gate electrode 27 of the transfer transistor $T_x$ and a $p^0$ diffusion area 31 formed in the $n^-$ diffusion area 29 by being self-aligned to the field stop layer 25 with a predetermined distance from the one side of the gate electrode 27.

Meanwhile, an $n^+$ diffusion layer 33 is formed at the other side of the gate electrode 27.

FIGS. 4A to 4E are cross-sectional views illustrating a process for fabricating the CMOS image sensor with respect to an I-I' line of FIG. 3. Also, FIGS. 5A to 5D are plane views illustrating a process for fabricating the CMOS image sensor with respect to the I-I' line of FIG. 3.

With reference to FIGS. 4A to 4E and FIGS. 5A to 5D, the process for forming the CMOS image sensor with respect to the I-I' line of FIG. 3 will be explained in more detail.

Figure 4A:
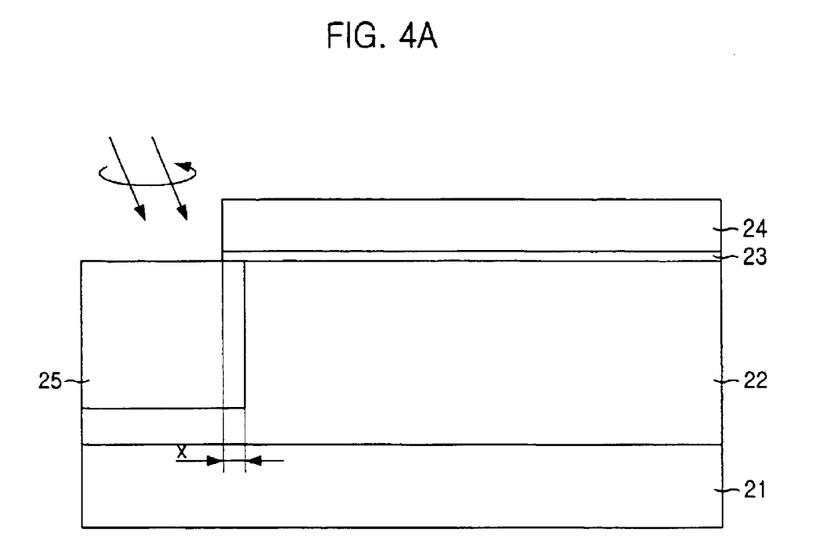
FIGS. 4A to 4E are cross-sectional views illustrating a process for fabricating the CMOS image sensor with respect to a I-I' line of FIG. 3.

Referring to FIG. 4A, a p-type epi layer 22 is grown on a $p^+$ substrate 21 doped with a high concentration of p-type impurities. On the p-type epi layer 22, a pad oxide layer 23 and a pad nitride layer 24 are formed thereafter.

Herein, the reason for growing the p-type epi layer 22 is because a depth of a depletion layer of the PD can be increased due to the existence of the p-type epi layer 22 with a low dopant concentration. As a result, it is possible to obtain an excellent photosensitivity and to prevent the crosstalk phenomenon, which occurs between unit pixels of the CMOS image sensor due to irregular movements of optical charges that may be taken place at the deeper $p^+$-substrate 21, by recombining the optical charges through the $p^+$-substrate 21 with the high dopant concentration.

Next, an isolation mask (not shown) is formed on the pad nitride layer 24. Subsequently, the pad nitride layer 24 exposed by the isolation mask is firstly etched. After etching the pad nitride layer, the exposed pad nitride layer 23 is then etched so as to expose a surface of the p-type epi layer 22 where a field oxide layer will be formed.

Herein, the exposed p-type epi layer 22 has an area where the field oxide layer is formed and the unexposed p-type epi layer 22 is an active area.

After removing the isolation mask, impurities for an n-channel field stop layer 25 (hereinafter referred as to field stop layer) are ion implanted partially on the surface of the exposed p-type epi layer 22 by giving a tilt angle through rotation and twist. Herein, the pad nitride layer 24 exposed through the removal of the isolation mask is used as a mask.

At this time, the ion implantation for forming the field stop layer 25 is proceeded by giving a predetermined tilt angle α and rotating four times with $3.0 \times 10^{13}$ cm of a dose quantity of boron ($B_{11}$) and 30 keV of ion implantation energy.

If the impurities are ion implanted with a tilted angle and rotations, the field stop layer 25 is expanded to the active area by distance X compared to the ion implantation without the tilt angle and the rotation. That is, the field stop layer formed through the ion implantation without the tilt angle and the rotation is merely allocated below the field oxide layer but is unable to penetrate to the active area.

Although an ion implantation mask for forming the field stop layer 25 uses the pad nitride layer 24, it is also possible to use an additional ion implantation mask.

Figure 5A:
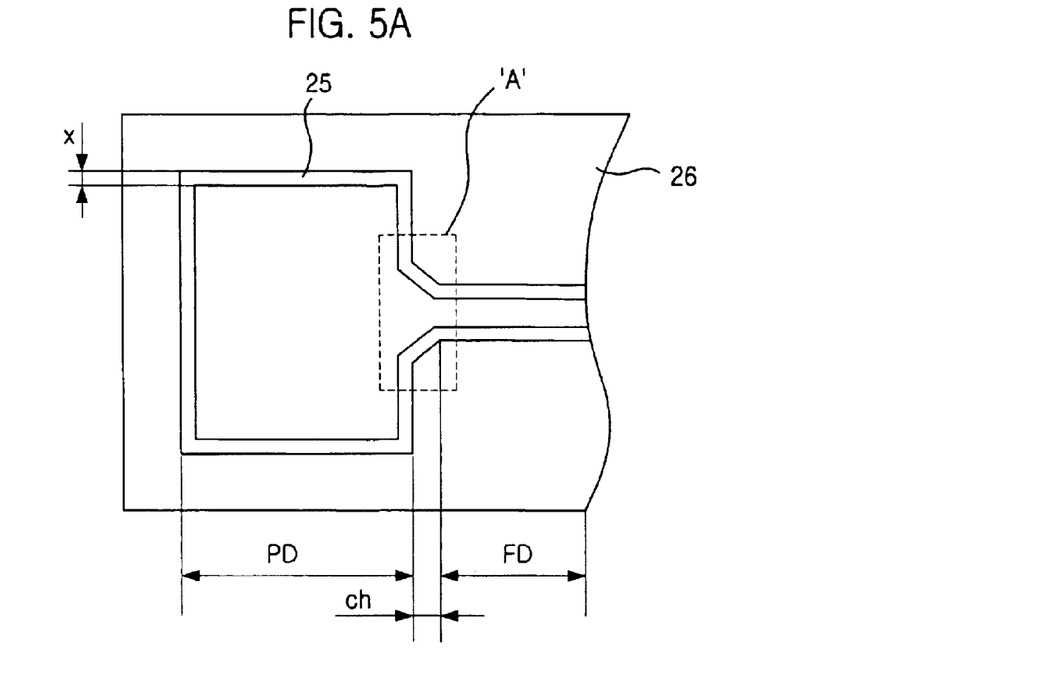
FIGS. 5A to 5D are plane views illustrating a process for fabricating the CMOS image sensor with respect to the I-I' line of FIG. 3.

With reference to FIG. 5A, the field stop layer 25 is formed and penetrated from the area where the field oxide layer will be formed to the exposed p-type epi layer 22 by a distance X.

Figure 4B:
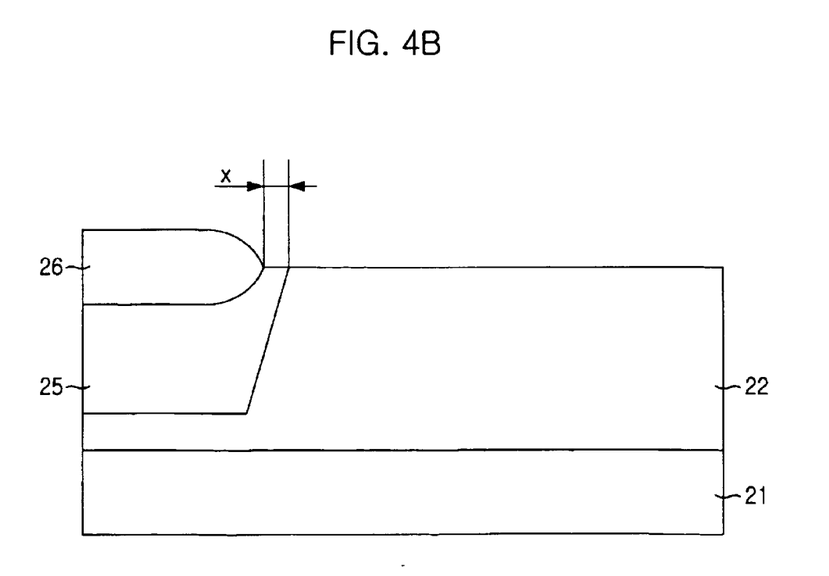

Referring to FIG. 4B, the surface of the p-type epi layer 22 where the field stop layer 25 is formed is oxidated so to grow the field oxide layer 26 on the field stop layer 25. Thereafter, the pad nitride layer 24 and the pad oxide layer 23 are removed.

At this time, the active area defined by the field oxide layer 26 can be classified into a first active area $ACT_1$ having a wide area, a second active area $ACT_2$ having a relatively smaller area and width of an long and short axis and a third active area $ACT_3$ having a bottle-neck structure 'A' (referred to FIG. 5A).

Herein, the first active area $ACT_1$ is an area for providing the PD, and the second active area $ACT_2$ is an area for providing the FD. The third active area $ACT_3$ is an area for providing a channel ch of the transfer transistor $T_x$.

Hereinafter, the first active area $ACT_1$, the second active area $ACT_2$ and the third active area $ACT_3$ are referred as to the PD, the FD and the channel area ch, respectively.

Meanwhile, before forming the field oxide layer 26, a p-well (not shown) is formed in a predetermined area of the p-type epi layer 22 as to include a drive transistor $D_x$ and a select transistor $S_x$ through a lateral expansion due to a subsequent thermal process.

Next, after removing the pad oxide layer 23, a general transistor fabrication process for forming the drive transistor $D_x$ and the select transistor $S_x$ among 4 transistors of the unit pixel.

Also, another ion implantation process (not shown) for a threshold voltage control ion that controls a threshold voltage of the transistor in the p-well and a deep ion implantation process (not shown) for p-type impurities that controls a punchthrough property are proceeded. However, these ion implantation processes are not proceeded at the active area where the PD will be formed and the area where a source/drain, i.e., the FD of the transfer transistor $T_x$.

Figure 4C:
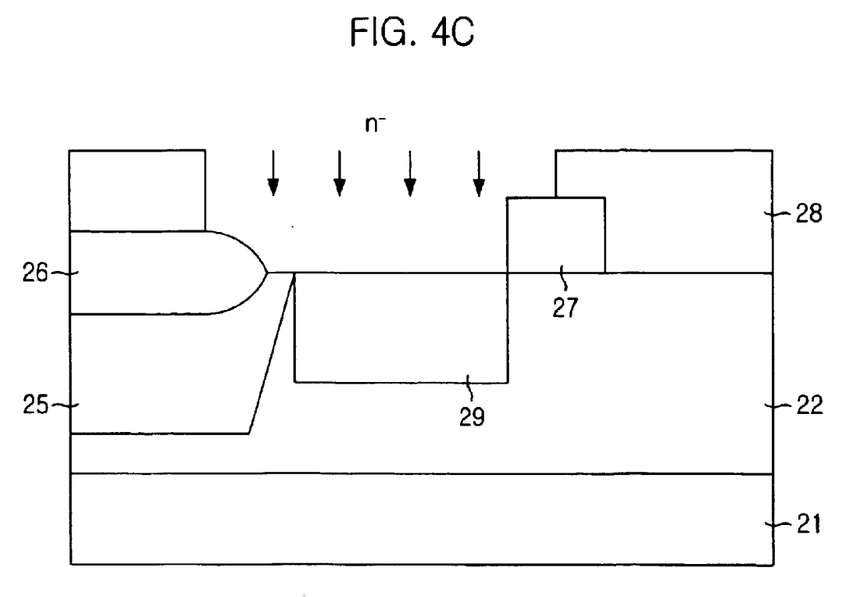

Referring to FIG. 4C, a conductive layer for forming the gate electrode 27 of the four transistors of the unit pixel is deposited. Then, a photosensitive film is coated and patterned through a photo-exposure process and a developing process so as to form a photosensitive pattern (not shown) for forming the gate electrode 27.

At this time, since a doping profile of the PD at one side of the transfer transistor $T_x$ determines charge transfer efficiency, the gate electrode 27 is formed to have a sufficient thickness so that ion implantations of high energy n-type impurities for forming the PD and low energy p-type impurities can be aligned at the one side of the transfer transistor $T_x$.

Afterwards, the conductive layer is etched by using the photosensitive pattern for forming the PD as an etch mask so as to form the gate electrode 27 of the four transistors of the unit pixel. Herein, the gate electrode 27 is the gate electrode of the transfer transistor $T_x$.

Figure 5B:
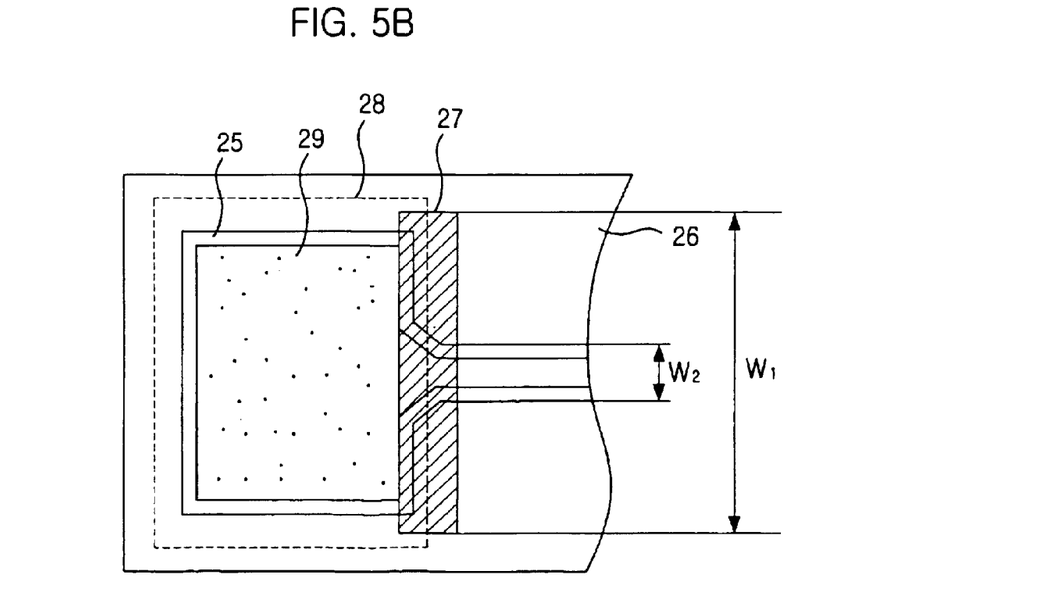

At this time, the gate electrode 27 can increase highly a width of long axis W1 overlapped with the active area where the PD will be formed since the third activation area $ACT_3$ located at a bottom of the gate electrode 27 has the bottleneck structure (referred to FIG. 5B).

Accordingly, in the transfer transistor $T_x$ of which channel area ch have the bottle-neck structure, a width W of the transistor that determines major parameters such as a drain current ($I_{dsat}$) and a threshold voltage $V_t$ is the width W2 of short axis of the FD not that W1 of long axis of the gate electrode 27 that is overlapped with the FD.

For instance, in case that currents are flowing from a path having a wide width to a path having a narrow width, the path having the narrow width determines a speed of the current flow. In other words, the path having the wide width is not related to the speed of the current flow.

Next, a photosensitive film is coated entirely on the structure including the gate electrode 27 and patterned selectively so as to form a first mask 28 for ion implanting a low concentration of the n-type impurities n⁻ with high energy.

At this time, one side of the first mask 28 is aligned to a center of the gate electrode 27 while the other side of the first mask 28 is aligned to a predetermined portion of the field oxide layer 26 without having any portion penetrates into the PD (referring to FIG. 5B).

Afterwards, an n⁻ diffusion layer 29 is formed through the ion implantation of the low concentration of the n-type impurities n⁻ with high energy by using the first mask 28 as an ion implantation mask.

At this time, one side of the n⁻ diffusion layer 29 is aligned to an edge of one side of the gate electrode 27 while the other side of the n⁻ diffusion layer 29 is aligned to an edge of one side of the field stop layer 25. That is, even if the ion implantation mask that opens a partial portion of the field oxide layer 26 is used, the n⁻ diffusion layer 29 is not contacted to the field oxide layer 26 due to the field stop layer 25 penetrated into the active area with the predetermined distance X.

In the end, the n⁻ diffusion layer 29 is self-aligned due to the gate electrode 27 and the field stop layer 25 as simultaneously as being isolated electrically from the edge of the field oxide layer 26 due to the field stop layer 25.

Also, both ends of the gate electrode 27 are expanded to cover sufficiently one side of the PD. Since the n⁻ diffusion layer 29 is self-aligned due to the field stop layer 25, it is possible to apply a reticle for forming a conventional n⁻ diffusion layer without any modification.

As described above, if the n⁻ diffusion layer 29 is formed by using the reticle without any modification, it is possible to reduce costs for forming a new reticle and freely control a distance between the field oxide layer 26 and the n⁻ diffusion layer 29. It is also possible to obtain a mask overlay margin due to the self-alignment of the n⁻ diffusion layer 29.

In case of using the new reticle for forming the n⁻ diffusion layer 29, it is difficult to control the distance between the field oxide layer 23 and the n⁻ diffusion layer 29.

Referring to FIG. 5B, the n⁻ diffusion layer 29 is self-aligned to the one side of the gate electrode 27 of which long axis becomes elongated. Meanwhile, the rest of sides of the n⁻ diffusion layer 29 except for the portion self-aligned to the one side of the gate electrode 27 are also self-aligned due to the field stop layer 25 and formed in the PD.

Therefore, since the n⁻ diffusion layer 29 is self-aligned only to the one side of the gate electrode 27 instead of aligning to both ends of the long axis of the gate electrode 27, it is possible to minimize a contact between corners of the n⁻ diffusion layer 29 and the field oxide layer 26. This contact is a cause for the dark current.

After removing the first mask 28, an ion implantation process for forming a lightly doped drain (LDD) structure of the four transistors of the unit pixel is proceed (not shown). Firstly, a photosensitive film is coated on entire structure and patterned through a photo-exposure process and a developing process so as to form a second mask (not shown) for forming the LDD structure.

Figure 4D:
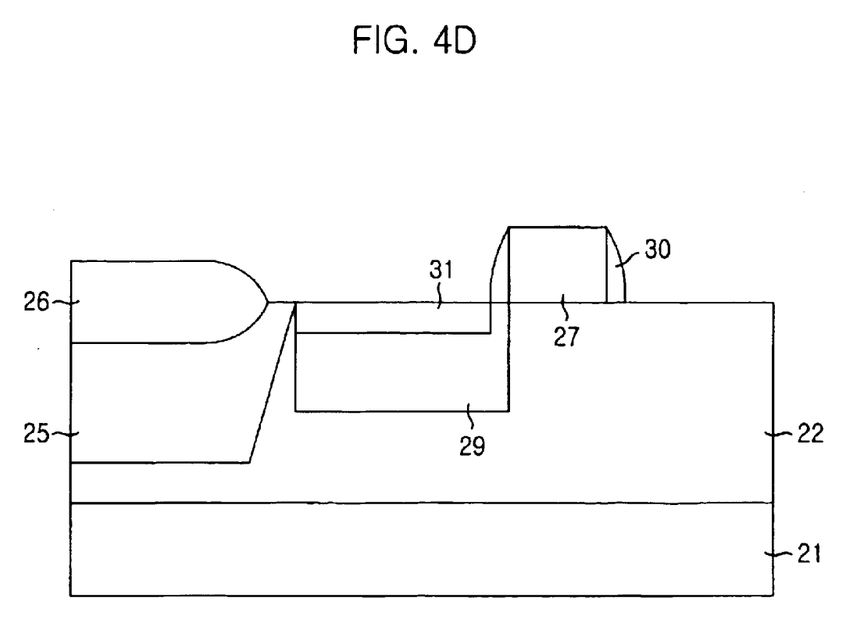

Referring to FIG. 4D, the second mask (not shown) is removed, and an insulating layer for a spacer is deposited on the entire structure. Then, the insulating layer is proceeded with an etch-back process so to form a spacer 30 at lateral sides of the gate electrode 27.

With use of a blanket ion implantation technique, low energy p-type impurities $p^0$ are ion implanted so that a $p^0$ diffusion layer 31 is formed on the n⁻ diffusion layer 29 and at the other side of the gate electrode 27 as simultaneously as on the exposed p-type epi layer 22. At this time, $p^0$ diffusion layer 31 formed in the n⁻ diffusion layer 29 is aligned to the spacer 30 with a distance as much as a thickness the spacer 30.

Meanwhile, the $p^0$ diffusion layer 31 is also formed on the p-type epi layer 22 exposed at the other side of the gate electrode 27 through the blanket ion implantation technique. However, this $p^0$ diffusion layer 31 does not have any specific effect since it uses the identical p-type impurities used for the p-type epi layer 22.

Through the ion implantation of the low energy p-type impurities $p^0$, a shallow pn junction including the $p^0$ diffusion layer 31 and the n⁻ diffusion layer 29 and a pnp-type PD including the p-type epi layer 22, the n⁻ diffusion layer 29 and the $p^0$ diffusion layer 31 are formed.

Figure 5C:
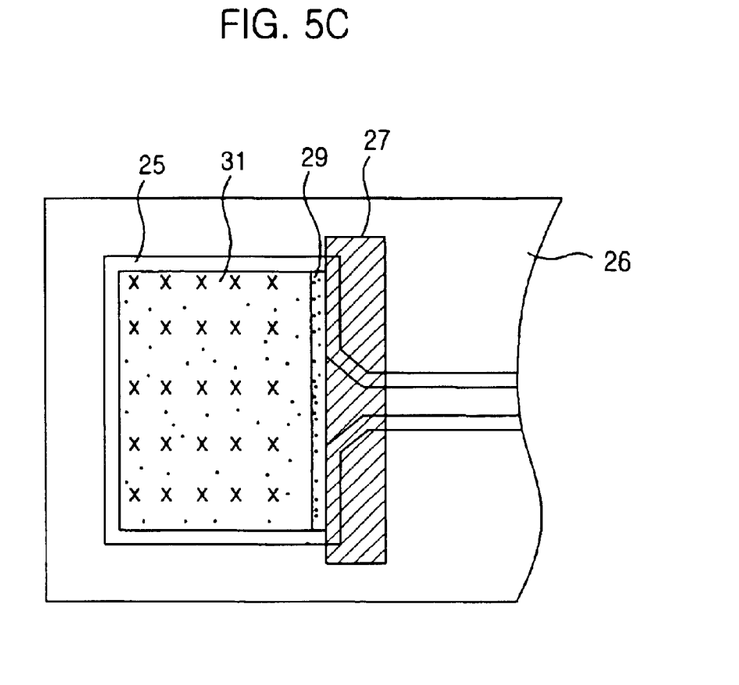

With reference to FIG. 5C, which showing a plane view of the p⁰ diffusion layer 31, one side of the p⁰ diffusion layer 31 is aligned to the spacer (not shown) while the rest of sides are self-aligned to the field stop layer 25.

Figure 4E:
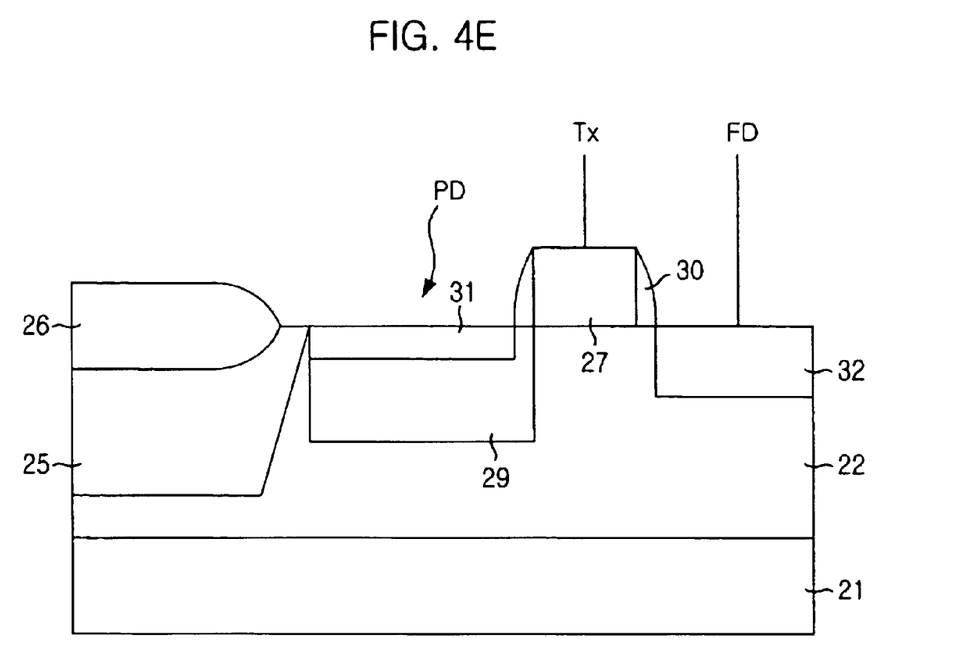

As shown in FIG. 4E, a photosensitive film is coated on the entire structure and patterned through a photo-exposure process and a developing process so to form a third mask (not shown) for forming a source/drain area. Then, n-type impurities n⁺ with a high concentration are ion implanted by using the third mask as an ion implantation mask so as to form an n⁺ diffusion layer 32. Herein, the n⁺ diffusion layer 32 is the source/drain area (not shown) of the drive transistor $D_x$ and the select transistor $S_x$ and that of the transfer transistor $T_x$ and the reset transistor $R_x$, i.e., the FD of the unit pixel.

Figure 5D:
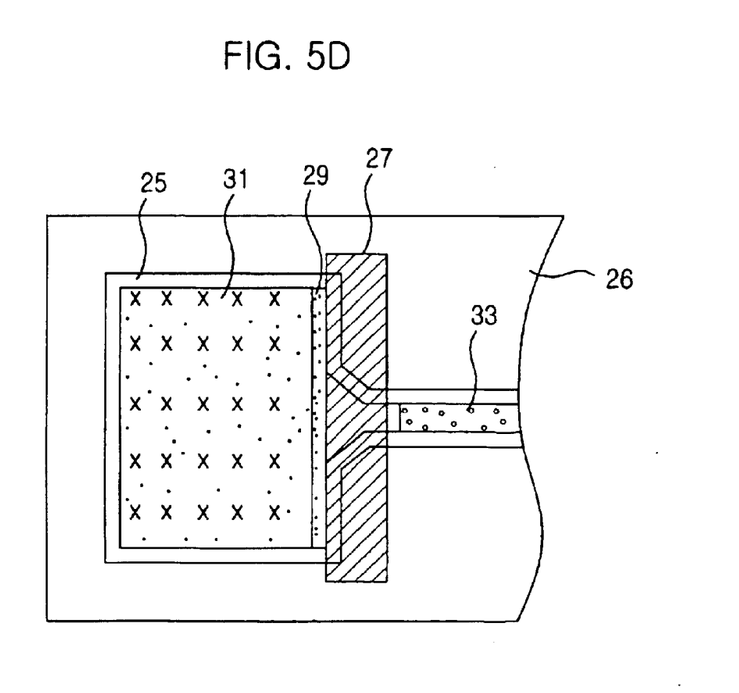

Referring to FIG. 5D, the third mask exposes the other side of the gate electrode 27 of the transfer transistor $T_x$ and the FD near to the other side of the gate electrode 27 but is aligned at a center of the gate electrode 27. That is, the ion implantation of the n-type impurities n⁺ with a high concentration does not occur at the area for providing the PD.

Figure 6:
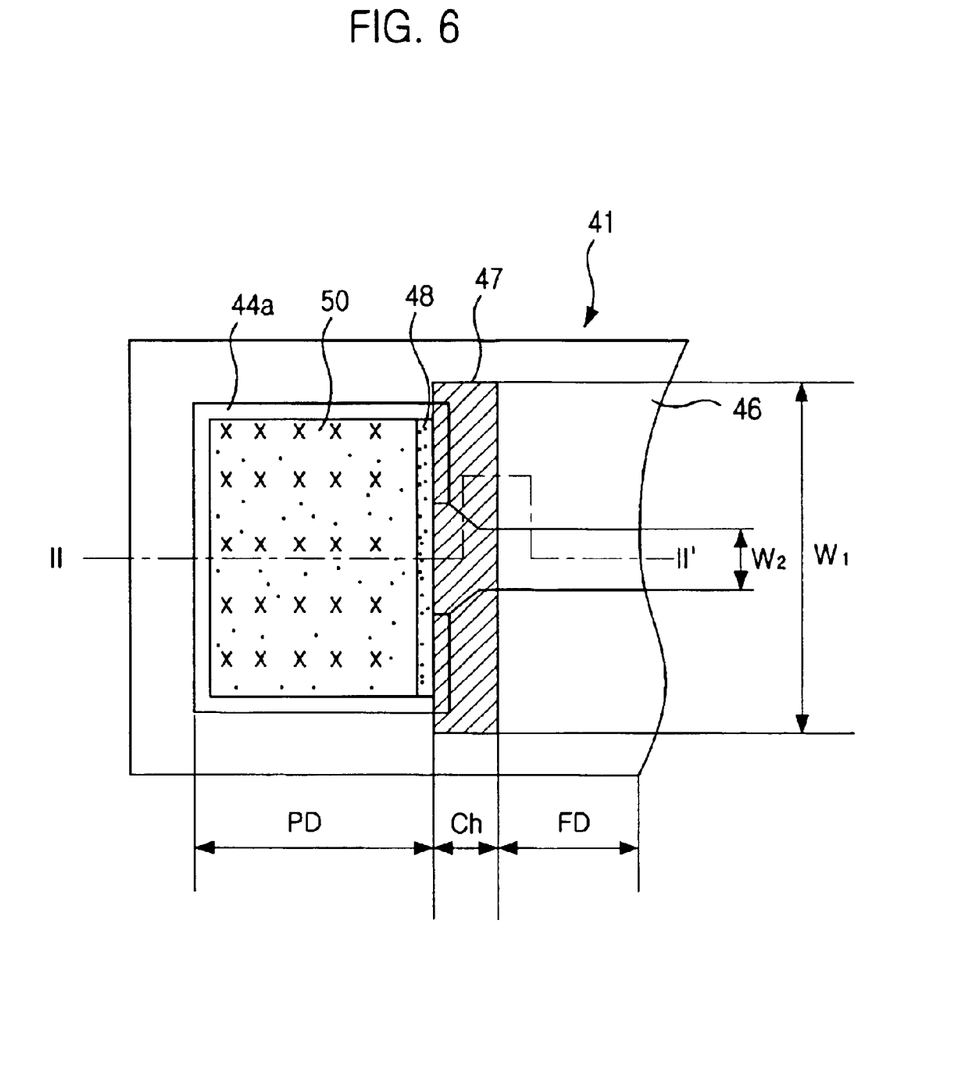
FIG. 6 is a plane view showing a CMOS image sensor in accordance with a second preferred embodiment of the present invention.

FIG. 6 is a plane view of a CMOS image sensor in accordance with a second preferred embodiment of the present invention.

With reference to FIG. 6, an active area including a substrate 41, a PD formed on a predetermined portion of the substrate 41, a FD having a relatively smaller area than the PD, a channel area ch having a bottle-neck structure connecting the PD and the FD is formed.

Then, a field oxide layer 46 for isolating electrically the active area is formed, and then a field stop layer 44A having a wider area than the field oxide layer 46 by extended towards the PD with a first predetermined width is formed below the field oxide layer 46.

That is, the field stop layer 44A is extended only to the active area where the PD will be formed, and formed below the channel area ch and the FD.

A gate electrode 47 having one side supposed with a second predetermined width with an entire area of one side of the PD and the other side is aligned to the FD as simultaneously as covering the channel area ch is formed on the substrate 41. Herein, the PD is connected to the channel area ch.

Meanwhile, the PD includes an n⁻ diffusion layer 48 formed through a self-alignment to the one side of the gate electrode 47 and the field stop layer 44A and a p⁰ diffusion layer 50 formed in the n⁻ diffusion layer 48 by being self-aligned to the field stop layer 44A with a predetermined distance from the one side of the gate electrode 47.

On the other side of the gate electrode 47, a n⁺ diffusion layer 51 is formed.

In the following second preferred embodiment, a method for proceeding an ion implantation process for forming the field stop layer by classifying the channel area of the transfer transistor $T_x$ sensitive to a tilt angle and other areas with each different mask will be described.

FIGS. 7A to 7D are cross-sectional views illustrating a process for fabricating the CMOS image sensor with respect to an II-II' line of FIG. 6.

Figure 7A:
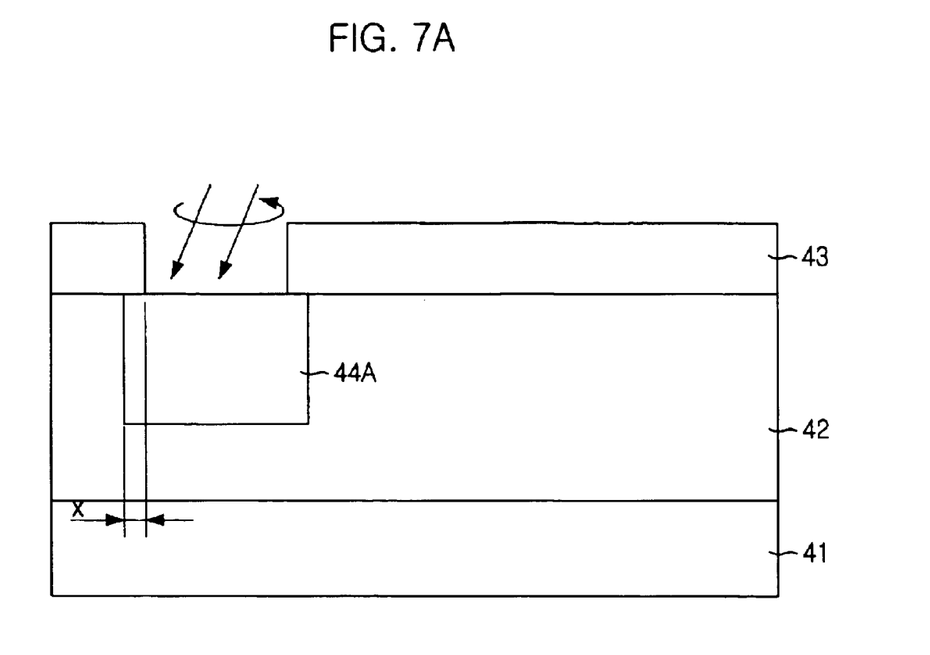
FIGS. 7A to 7D are cross-sectional views illustrating a process for fabricating the CMOS image sensor with respect to a II-II' line of FIG. 6.

Referring to FIG. 7A, a p-type epi layer 42 is grown on a p⁺ substrate 41 doped with a high concentration of p-type impurities. Subsequently, a first ion implantation mask 43 is formed on the p-type epi layer 42.

At this time, the p-type epi layer 42 exposed by the first ion implantation mask 43 is an area where a field oxide layer allocated close to the PD is formed.

Next, impurities for forming a first field stop layer 44A are ion implanted on the exposed p-type epi layer 42 by giving a tilt angle and rotations or twists.

At this time, the ion implantation for forming the first field stop layer 44A is proceeded with a predetermined tilt angle α and 4 times of rotations by using $3.0 \times 10^{13}$ cm⁻³ of a dose quantity of boron ($B_{11}$) and 30 keV of ion implantation energy.

As described above, if the impurities are ion implanted with the tilt angle and the rotations, the first field stop layer 44A has an increased overlapping distance X with the active area compared to the ion implantation without any tilt angle and the rotation.

With reference to FIG. 6, which is a plane view of the first field stop layer 44A, the field stop layer 44A is formed with a distance X penetrated into the PD from the area where the field oxide layer will be formed.

Figure 7B:
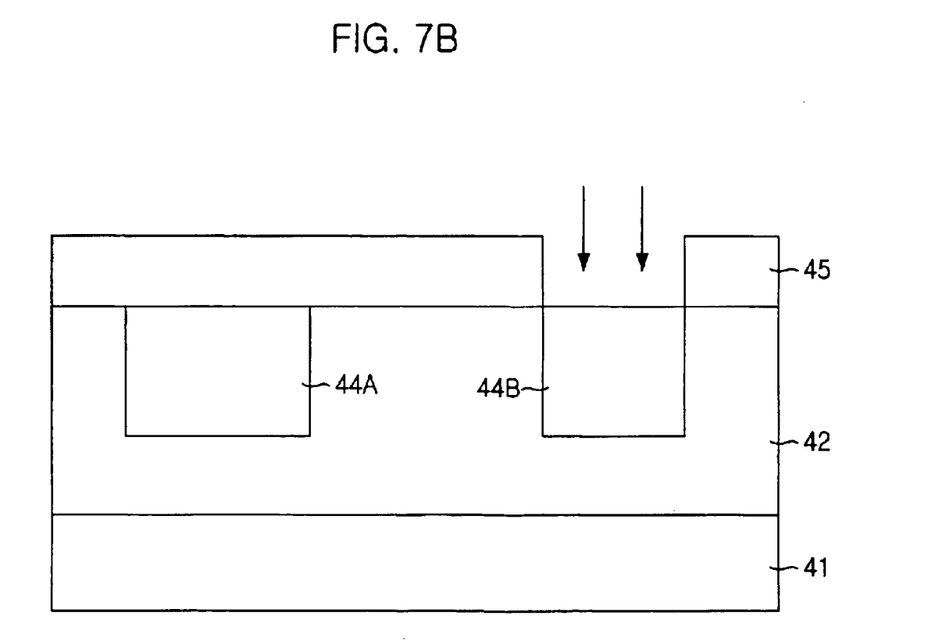

Referring to FIG. 7B, after removing the first ion implantation mask 43, a second ion implantation mask 45 is formed entirely on the above structure. At this time, the p-type epi layer 42 exposed by the second ion implantation mask 45 is an area where the field oxide layer near to the channel area ch of the transfer transistor $T_x$.

Next, impurities for forming a second field stop layer 44B are ion implanted on the exposed p-type epi layer r42 without any tilt angle.

At this time, the ion implantation for forming the second field stop layer 44B is proceeded with $3.0 \times 10^{13}$ cm⁻³ of a dose quantity of boron (B11) and 30 keV of ion implantation energy.

In case that the impurities are ion implanted without the tilt angle, the first field stop layer 44A is not overlapped with the active area. Thus, this case does not appear in FIG. 6.

Meanwhile, the first ion implantation mask 43 and the second ion implantation mask 45 uses the identical pad oxide layer and the pad nitride layer for a LOCOS process explained in the first preferred embodiment. However, the first and the second ion implantation masks 43 and 45 uses each different reticles.

In other words, the pad oxide layer and the pad nitride layer are simultaneously patterned to expose a portion of the p-type epi layer 42 where the first field stop layer 44A will be formed. Subsequently, an ion implantation for forming the first field stop layer 44A is proceeded. In continuous to the ion implantation for the first field stop layer 44A, the rest of the p-type epi layer 42 except for the portion for the first field stop layer 44A are exposed, and another ion implantation for forming the second field stop layer 44B is proceeded.

Figure 7C:
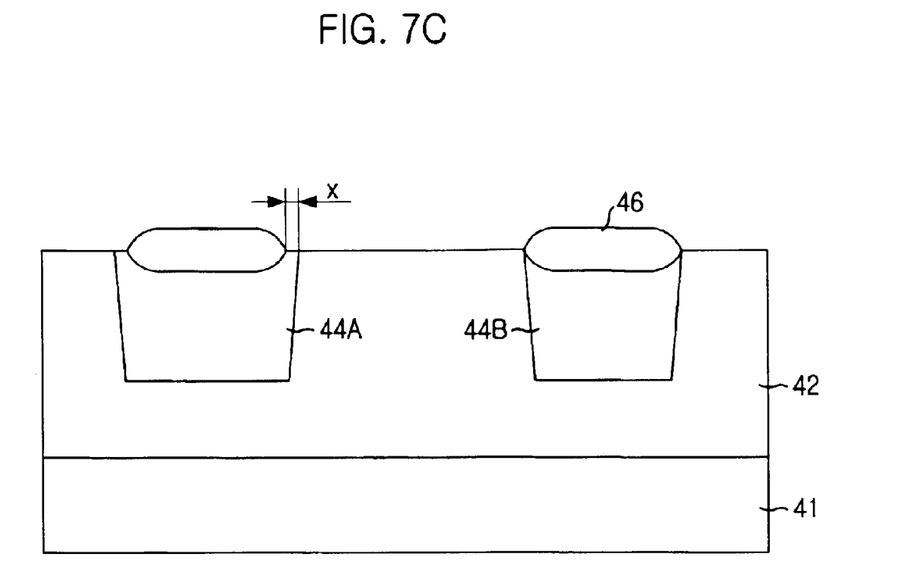

With reference to FIG. 7C, the surface of the p-type epi layer 42 for providing the first and the second field stop layers 44A and 44B are oxidated, and then grow the field oxide layer 46 on the first and the second field stop layer 44A and 44B.

Herein, the first field stop layer 44A penetrated to the active area for providing the PD with a predetermined distance X isolates electrically the active area and the field oxide layer 46. However, this first field stop layer 44A does not isolate electrically the active area for providing the channel area ch of the transfer transistor $T_x$ and a bottom part of the field oxide layer closed to the active area for the channel area ch.

All process for forming a subsequent gate electrode including an n⁻ diffusion layer and a p⁰ diffusion layer are identical to the processes described in the first preferred embodiment.

Figure 7D:
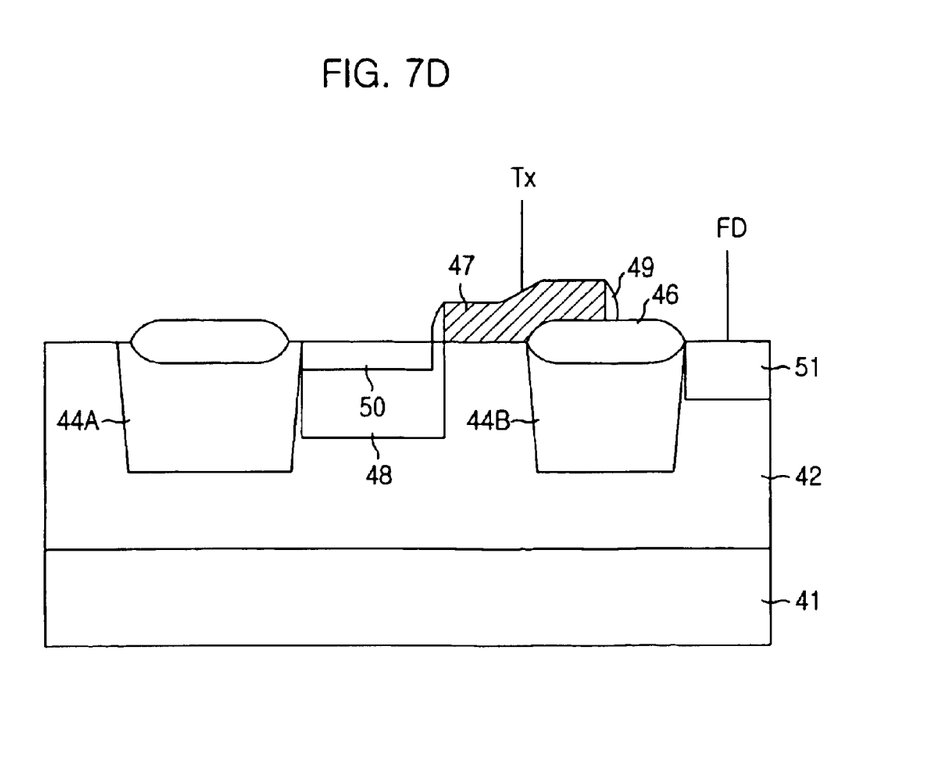

Referring to FIG. 7D, a gate electrode 47 of four transistors is formed on the p-type epi layer 42. Herein, the gate electrode 47 shown in FIG. 7D is the gate electrode of the transfer transistor $T_x$.

At this time, since the gate electrode 47 has a bottle-neck structure at a bottom part, it is possible to highly increase a width W1 of a long axis superposed on the active area for providing the PD.

Therefore, with respect to the transfer transistor $T_x$ of which channel area has the bottle-neck structure, a width of the transistor that determines major parameters such as a drain current ($I_{dsat}$) and a threshold voltage ($V_t$) is the width W2 of a short axis of the FD not the width W1 of the long axis of the gate electrode 47.

Next, a low concentration of n-type impurities n⁻ are ion implanted by using an ion implantation mask of which one side is aligned to a center of the gate electrode 47 and the other side is aligned to a predetermined portion of the field oxide layer 46 without having portions penetrated into the PD so as to form an n⁻ diffusion layer 48.

After forming a LDD structure, an insulating layer for a spacer is deposited on the above entire structure. The insulating layer is then proceeded with an etch-back process so to form a spacer 49 contacting to both lateral sides of the gate electrode 47.

Through the blanket ion implantation technique, low energy p-type impurities p⁰ are ion implanted so that a p⁰ diffusion layer 50 is formed on the n⁻ diffusion layer 48 and simultaneously on the p-type epi layer 42 exposed at the other side of the gate electrode 47. At this time, the p⁰ diffusion layer 50 formed in the n⁻ diffusion layer 48 is aligned to the spacer 49 with a distance as same as a thickness of the spacer 49.

A shallow pn junction including the p⁰ diffusion layer 50 and the n⁻ diffusion layer 48 is formed through the ion implantation of the low energy p-type impurities p⁰. Also, a pnp-type PD including the p-type epi layer 42, the n⁻ diffusion layer 48 and the p⁰ diffusion layer 50 is formed.

Next, a high concentration of n-type impurities n⁺ are ion implanted through the use of an ion implantation mask that exposes the p-type epi layer 42 where an n⁺ diffusion layer will be formed so as to form an n⁺ diffusion layer 51. The n⁺ diffusion layer 51 is a source/drain area (not shown) of a drive transistor $D_x$ and a select transistor $S_x$ and a source/drain area of the transfer transistor $T_x$ and a reset transistor $R_x$, i.e., the FD.

The first and the second preferred embodiments can be used not only in a process for fabricating the CMOS image sensor but also in other processes applicable for controlling the dark current of a charge coupled device (CCD).

The present invention provides an effect of fabricating the CMOS image sensor with high immunity against the dark current.

When proceeding the ion implantation process for forming the deep n⁻ diffusion layer constituting the PD, it is possible to improve a process margin since a dark current elimination structure capable of an self-alignment is applied.

Also, instead of fixing a distance between the n⁻ diffusion layer and the field oxide layer with a reticle, the distance is variable in accordance with a tilt angle during the formation of the n⁻ diffusion layer, thereby providing an effect of easily controlling optical characteristics of the CMOS image sensor.

While the present invention has been described with respect to certain preferred embodiments, it will be apparent to those skilled in the art that various changes and modifications may be made without departing from the scope of the invention as defined in the following claims.

What is claimed is:

1. An image sensor, comprising:
   a semiconductor substrate;
   an active area including a photodiode area formed in a predetermined position of the substrate, a floating diffusion area having a smaller area than the photodiode area and a channel area having a bottle-neck structure connecting to the photodiode area and the floating diffusion area;
   a field area for isolating electrically the active area;
   a field stop layer being formed beneath the field area and being wider than the field area in a direction towards the active area; and
   a gate electrode formed on the substrate by covering the channel area and a portion of the photodiode contacted to the channel area.

2. The image sensor as recited in claim 1, wherein the photodiode area further includes:
   a first diffusion layer formed in the photodiode area by being aligned to one side of the gate electrode and the field stop layer; and
   a second diffusion layer formed in the first diffusion layer being aligned to the field stop layer with a predetermined distance from the one side of the gate electrode.

3. The image sensor as recited in claim 1, wherein the gate electrode is aligned to the floating diffusion area.

4. An image sensor, comprising:
   a substrate;
   an active area including a photodiode area formed in a predetermined position of the substrate, a floating diffusion area having a smaller area than the photodiode area and a channel area having a bottle-neck structure connecting to the photodiode area and the floating diffusion area;
   a field area for isolating electrically the active area;
   a field stop layer being formed beneath the field area and being wider than the field area in a direction towards the active area; and
   a gate electrode formed on the substrate by covering the channel area and a portion of the photodiode contacted to the channel area.

5. A method for fabricating an image sensor, comprising the steps of:
   forming an isolation mask that exposes partially a surface of a substrate;
   forming a first diffusion layer having a wider area than an area of the partially exposed substrate;
   forming a field oxide layer having a smaller area than the first diffusion layer on the first diffusion layer;
   forming a gate electrode on an active area of the substrate defined by the, field oxide layer;
   forming a second diffusion layer being aligned to an edge of one side of the gate electrode in the substrate and to the first diffusion layer; and
   forming a third diffusion layer being aligned with a predetermined distance from the edge of the one side of the gate electrode formed in the second diffusion layer.

6. The method as recited in claim 5, wherein the step of forming the first diffusion layer is proceeded with an ion implantation that gives impurities a plurality of rotations or twists with a predetermined tilt angle.

7. The method as recited in claim 5, wherein the active area of the substrate defined by the field oxide layer includes a photodiode area, a floating diffusion area having a smaller area than the photodiode area and a channel area having a bottle-neck structure connecting the photodiode area and the floating diffusion area, wherein the gate electrode has one entire side of the floating diffusion area.

8. A method for forming an image sensor, comprising the steps of:

forming a first isolation mask that exposes a portion of a surface of one side of a substrate;

forming a first diffusion layer having a wider area than an exposed area of the substrate;

forming on the substrate a second isolation mask that exposes the other side of the substrate;

forming a second diffusion layer having an area identical to an exposed area of the substrate;

forming on the first diffusion layer a first field oxide layer having a smaller area than the first diffusion layer, and simultaneously forming on the second diffusion layer a second field oxide layer having an area identical to the second diffusion layer;

forming a gate electrode extending on the active area of the substrate and simultaneously on the second field oxide layer;

forming a third diffusion layer being aligned to an edge of one side of the gate electrode in the substrate and the first diffusion layer; and forming a fourth diffusion layer being aligned with a predetermined distance from the edge of the one side of gate electrode in the third diffusion layer.

9. The method as recited in claim 8, wherein the step of forming the first diffusion layer is proceeded with an ion implantation that gives impurities a plurality of rotations or twists with a predetermined tilt angle.

10. The method as recited in claim 8, wherein the step of forming the second diffusion layer is proceeded with an ion implantation that implants impurities vertically.

* * * * *